US008461628B2

(12) United States Patent
Choi et al.

(10) Patent No.: US 8,461,628 B2
(45) Date of Patent: Jun. 11, 2013

(54) MOS TRANSISTOR WITH LASER-PATTERNED METAL GATE, AND METHOD FOR MAKING THE SAME

(75) Inventors: Criswell Choi, Sunnyvale, CA (US); Joerg Rockenberger, Redwood City, CA (US); J. Devin MacKenzie, San Carlos, CA (US); Christopher Gudeman, Los Gatos, CA (US)

(73) Assignee: Kovio, Inc., San Jose, CA (US)

( * ) Notice: Subject to any disclaimer, the term of this patent is extended or adjusted under 35 U.S.C. 154(b) by 625 days.

(21) Appl. No.: 11/203,563

(22) Filed: Aug. 11, 2005

(65) Prior Publication Data
US 2006/0211187 A1    Sep. 21, 2006

Related U.S. Application Data

(60) Provisional application No. 60/663,296, filed on Mar. 18, 2005.

(51) Int. Cl.
  H01L 29/66   (2006.01)
  H01L 21/336  (2006.01)
  H01L 21/8234 (2006.01)
  H01L 29/772  (2006.01)

(52) U.S. Cl.
  USPC ............ 257/213; 257/368; 438/197; 438/587

(58) Field of Classification Search
  USPC .................. 438/487, 199, 618, 622, 689, 690,
    438/694, 940, 685, 686, 687, 688, 660, 661,
    438/662, 795, 800, FOR. 109, FOR. 437,
    438/FOR. 352, FOR. 354, FOR. 405; 257/202,
    257/204, 209, 388, 412, 211, E29.158, E29.16,
    257/E21.621, E21.625, 368, 87, E21.028,
    257/E21.596, E29.128, E29.134
See application file for complete search history.

(56) References Cited

U.S. PATENT DOCUMENTS 4,769,686 A * 9/1988 Horiuchi et al. ............... 257/373
5,039,625 A * 8/1991 Reisman et al. ............... 438/297
(Continued)

FOREIGN PATENT DOCUMENTS
JP   2003015295 A   1/2003
JP   2004031933 A   1/2004
(Continued)

OTHER PUBLICATIONS

H. Somberg: Ink Jet Printing for Metalilization on Very Thin Solar Cells; IEEE 1990, pp. 866-867: Global Photovoltale Specialists, Inc: Canogo Park, California USA.

(Continued)

*Primary Examiner* — Olik Chaudhuri
*Assistant Examiner* — Quovaunda V Jefferson
(74) *Attorney, Agent, or Firm* — Andrew D. Fortney (57) ABSTRACT

A MOS transistor with a laser-patterned metal gate, and methods for its manufacture. The method generally includes forming a layer of metal-containing material on a dielectric film, wherein the dielectric film is on an electrically functional substrate comprising an inorganic semiconductor; laser patterning a metal gate from the metal-containing material layer; and forming source and drain terminals in the inorganic semiconductor in locations adjacent to the metal gate. The transistor generally includes an electrically functional substrate; a dielectric film on at least portions of the electrically functional substrate; a laser patterned metal gate on the dielectric film; and source and drain terminals comprising a doped inorganic semiconductor layer adjacent to the metal gate. The present invention advantageously provides MOS thin film transistors having reliable electrical characteristics quickly, efficiently, and/or at a low cost by eliminating one or more conventional photolithographic steps.

46 Claims, 3 Drawing Sheets

U.S. PATENT DOCUMENTS

| | | | |
|---|---|---|---|
| 5,132,248 A | | 7/1992 | Drummond et al. |
| 5,561,030 A | | 10/1996 | Holdcroft et al. |
| 5,576,225 A | * | 11/1996 | Zhang et al. .................. 438/158 |
| 5,612,235 A | | 3/1997 | Wu et al. |
| 5,658,808 A | | 8/1997 | Lin |
| 5,679,138 A | | 10/1997 | Bishop et al. |
| 5,763,904 A | * | 6/1998 | Nakajima et al. ............... 257/66 |
| 5,821,137 A | | 10/1998 | Wakai et al. |
| 5,926,735 A | * | 7/1999 | Yamazaki et al. ............ 438/635 |
| 5,989,944 A | | 11/1999 | Yoon |
| 5,989,945 A | | 11/1999 | Yudasaka et al. |
| 6,051,884 A | * | 4/2000 | Papadas ........................ 257/774 |
| 6,245,602 B1 | | 6/2001 | Ho et al. |
| 6,255,033 B1 | | 7/2001 | Levanon et al. |
| 6,274,412 B1 | | 8/2001 | Kydd et al. |
| 6,294,401 B1 | | 9/2001 | Jacobson et al. |
| 6,294,820 B1 | * | 9/2001 | Lucas et al. .................... 257/412 |
| 6,316,357 B1 | | 11/2001 | Lin et al. |
| 6,323,069 B1 | | 11/2001 | Yamazaki et al. |
| 6,337,117 B1 | | 1/2002 | Maenosono et al. |
| 6,348,295 B1 | | 2/2002 | Griffith et al. |
| 6,379,745 B1 | | 4/2002 | Kydd et al. |
| 6,387,597 B1 | | 5/2002 | Gelbart |
| 6,391,690 B2 | * | 5/2002 | Miyasaka ....................... 438/149 |
| 6,509,217 B1 | | 1/2003 | Reddy |
| 6,511,870 B2 | | 1/2003 | Chen et al. |
| 6,518,087 B1 | | 2/2003 | Furusawa et al. |
| 6,541,181 B1 | | 4/2003 | Levanon et al. |
| 6,541,354 B1 | | 4/2003 | Shimoda et al. |
| 6,593,064 B1 | | 7/2003 | Gelbart |
| 6,641,978 B1 | | 11/2003 | Chapman et al. |
| 6,664,027 B2 | | 12/2003 | Griffith et al. |
| 6,719,916 B2 | | 4/2004 | Dubowski et al. |
| 6,746,102 B2 | | 6/2004 | Shinkoda et al. |
| 6,767,775 B1 | | 7/2004 | Yudasaka et al. |
| 6,864,133 B2 | | 3/2005 | Aoki et al. |
| 6,878,184 B1 | | 4/2005 | Rockenberger et al. |
| 6,921,621 B2 | | 7/2005 | Nitta et al. |
| 7,018,872 B2 | | 3/2006 | Hirai et al. |
| 7,052,980 B2 | | 5/2006 | Aoki |
| 7,150,956 B2 | | 12/2006 | Nitta et al. |
| 7,179,733 B2 | | 2/2007 | Sato et al. |
| 7,528,017 B2 | * | 5/2009 | Subramanian et al. ........ 438/141 |
| 2003/0082485 A1 | * | 5/2003 | Bulthaup et al. ............... 430/312 |
| 2003/0180451 A1 | | 9/2003 | Kodas et al. |
| 2003/0190550 A1 | | 10/2003 | Nitta et al. |
| 2003/0211649 A1 | | 11/2003 | Hirai et al. |
| 2004/0175631 A1 | * | 9/2004 | Crocker et al. .................... 430/5 |
| 2004/0192042 A1 | * | 9/2004 | Sirringhaus et al. .......... 438/689 |
| 2004/0242008 A1 | | 12/2004 | Sato et al. |
| 2004/0248429 A1 | | 12/2004 | Aoki et al. |
| 2005/0112498 A1 | | 5/2005 | Nitta et al. |
| 2005/0133790 A1 | | 6/2005 | Kato |
| 2005/0134463 A1 | | 6/2005 | Yamazaki |
| 2005/0148121 A1 | | 7/2005 | Yamazaki et al. |
| 2005/0176183 A1 | | 8/2005 | Aoki et al. |
| 2005/0176191 A1 | * | 8/2005 | Kumar et al. .................. 438/197 |
| 2005/0181566 A1 | | 8/2005 | Machida et al. |
| 2010/0022078 A1 | * | 1/2010 | Rockenberger et al. ....... 438/585 |

FOREIGN PATENT DOCUMENTS

| | | | |
|---|---|---|---|
| JP | 2004304162 A | | 10/2004 |
| JP | 2004311945 A | | 11/2004 |
| JP | 2004349583 A | | 12/2004 |
| KR | 19960026428 A1 | | 7/1996 |
| WO | WO 00/59041 | | 10/2000 |
| WO | WO 0146987 A2 | | 6/2001 |
| WO | WO 0146987 A3 | | 6/2001 |

OTHER PUBLICATIONS

James Montague Cleeves; MOS Transistor with Self-Aligned Source and Drain, and Method for Making the Same; U.S. Appl. No. 11/084,448; filed Mar. 18, 2005.

Marinko V. Sarunic, Glenn H. Chapman & Yuqlang Tu; A Prototype Laser Activated Bimetallic Thermal Resist for Microfabrication; Laser Applications in Microelectronic and Optoelectronic Mfg. VI; Proc. SPIE; vol. 4274; 2001; Editors: M. Gower, H. Helvajian, K. Sugioka & J. Dubowski.

Jeffery Parker & Wayne Renken; In Situ Wafer and Photomask Temperature Metrology for CD Control in Deep Lithography; SensArray Corp., 3410 Garrett Drive, Santa Clara, CA 95054; 8 Pgs.

Creo Positive Thermal Plate; Creo Inc., 3700 Gilmore Way, Burnaby, BC, Canada V5G 4M1, www.creo.com; 4 Pgs.

Creo Enters Gravure Market with Innovative Exactus System; Feb. 20, 2004; http://www.creo.com/global/about_creo/news/2004/; 3 Pgs.

SQUAREspot thermal imaging technology; Creo SQUAREspot Thermal Imaging—optimum imaging for CTP; 2005; http://www.creo.com/global/products/output/imaging_technology/squarespot_imaging/; 2 Pgs.

Zhibin Xiong et al.; A Novel Self-Aligned Offset-Gated Polysilicon TFT Using High-K Dielectric Spacers; IEEE Electron Dev. Letters; vol. 25, No. 4; Apr. 2004; pp. 194-195.

J. H. Lee et al.; The Improvement of Reliability in the Poly-Si TFTs Employing Laser Irradiation on Gate Oxide; AM-LCD '03; pp. 169 et seq. (TFTp3-3).

Hongmei Wang et al.; High Frequency Performance of Large-Grain Polysilicon-on-Insulator MOSFETs; IEEE Transactions on Electron Devices; vol. 48, No. 7; Jul. 2001; pp. 1480-1482.

Taiwanese Office Action; Taiwanese Patent Application No. 095108873; Dated: Aug. 27, 2008; Taiwan Intellectual Property Office; Taiwan, R.O.C.

Korean Office Action dated Jun. 1, 2009; Korean Patent Application No. 10-2006-0024949; Korean Intellectual Property Office, Republic of Korea.

Dae-Kyu Mun; "Method for Manufacturing a Thin Film Transistor"; Korean Patent Abstracts; Publication No. 1996-0026428; Publication Date: Jul. 22, 1996; Korean Intellectual Property Office, Republic of Korea.

Notice of Reasons for Rejection dated Aug. 16, 2011; Japanese Patent Application No. 2006064769; Japan Patent Office, Japan.

Katsura Hirai; "Method for Manufacturing Organic Thin-Film Transistor, and Organic Thin-Film Transistor and Organic Transistor Sheet Manufactured Using the Same"; Espacenet; Japanese Publication No. JP 2004031933 (A); Publication Date: Jan. 29, 2004; Espacenet Database—Worldwide; http://worldwide.espacenet.com/.

Kazuo Yudasaka and Mitsuru Sato; "Method of Forming Contact Hole, Method of Manufacturing Thin Film Semiconductor Device, Electronic Device and Method of Manufacturing the Same"; Espacenet; Japanese Publication No. JP 2004304162 (A); Publication Date: Oct. 28, 2004; Espacenet Database—Worldwide; http://worldwide.espacenet.com/.

Takashi Aoki; "Method of Manufacturing Transistor, Electro-Optical Device and Electronic Apparatus"; Espacenet; Japanese Publication No. JP 2004311945 (A); Publication Date: Nov. 4, 2004; Espacenet Database—Worldwide; http://worldwide.espacenet.com/.

Takeshi Hara, Tatsuya Fujita, Hisao Ochi, Hiroto Yoshioka, Toshinori Sugihara, Masashi Kawasaki and Hideo Ono; "Manufacturing Method of Transistor"; Espacenet; Japanese Publication No. JP 2004349583 (A); Publication Date: Dec. 9, 2004; Espacenet Database—Worldwide; http://worldwide.espacenet.com/.

Japanese Final Notice of Reasons for Rejection with English Translation dated Mar. 27, 2012; Japanese Patent Application No. P2006-064769; 5 pages total; Japan Patent Office, Japan.

Kazuyuki Nitta, Takeyoshi Mimura, Satoshi Shimatani, Kazuyoshi Okubo and Tatsuya Matsuumi; "Resist Pattern Forming Material"; Publication No. JP 2003015295 A; Publication Date: Jan. 15, 2003; Abstract from espacenet database, European Patent Office.

* cited by examiner

FIG. 8

MOS TRANSISTOR WITH LASER-PATTERNED METAL GATE, AND METHOD FOR MAKING THE SAME

RELATED APPLICATIONS

This application claims the benefit of U.S. Provisional Application No. 60/663,296, filed Mar. 18, 2005, and may be related to U.S. application Ser. No. 11/084,448, filed Mar. 18, 2005, entitled "MOS Transistor with Self-Aligned Source and Drain, and Method for Making the Same," both of which are incorporated herein by reference in their entireties.

FIELD OF THE INVENTION

The present invention generally relates to the field of metal-oxide-semiconductor (MOS) transistors and methods of making the same. More specifically, embodiments or the present invention pertain to MOS thin film transistor structures having laser-patterned metal gates and methods for their manufacturing and/or production.

DISCUSSION OF THE BACKGROUND

The feasibility of building a GHz thin film transistor (TFT) based on polysilicon, as well as technology to measure the characteristics of such TFTs, is known in the art. High resolution lithography combined with mobility enhancing recrystallization techniques including laser recrystallization and metal induced lateral crystallization, can deliver both p- and n-channel transistors capable of operating at >2.4 GHz.

A need still exists for low-cost or cost-effective process technology for making such TFTs. The present invention concerns an electronic device (and in particular, a MOS transistor structure) and a process for making the same, utilizing laser patterned metal gate technology, designed to meet such needs for GHz TFTs and which may provide a low-cost, high throughput process for forming patterned metal structures in such devices.

SUMMARY OF THE INVENTION

Embodiments of the present invention relate to an electronic device, such as a MOS transistor, having a laser-patterned metal gate, and a method of making the same. The method generally comprises the steps of forming a layer of metal-containing material on a dielectric film, wherein the dielectric film is on an electrically functional substrate comprising an inorganic semiconductor; laser patterning a metal gate from the metal-containing material layer; and forming source and drain terminals in the inorganic semiconductor in locations substantially adjacent to the metal gate. The MOS transistor generally comprises (a) an electrically functional substrate in which gate-controlled conduction can take place (e.g., in a TFT, a semiconductor thin film); (b) a dielectric film on portions of the electrically functional substrate, (c) a laser-patterned metal gate on the dielectric film; and (d) source and drain terminals comprising a (heavily) doped inorganic semiconductor layer on or in the substrate, substantially adjacent to the metal gate.

The present invention advantageously provides a low cost method for making MOS thin film transistors (MOS TFTs) having reliable, commercially acceptable electrical characteristics (e.g., input capacitances, switching speeds, on/off ratios, effective carrier mobilities, threshold voltages [$V_t$'s], etc.). Transistors having laser-defined (and especially laser-written) gate conductor structures provide (1) results similar to those produced by more conventional semiconductor processing, but at a much lower cost and at a much higher throughput (on the order of hours to days, as opposed to weeks to months) than conventional MOS semiconductor process technology, and (2) higher resolution patterning capability and similar or higher throughput as compared to conventional graphic arts printing technology (e.g., inkjetting). Also, transistors having laser-defined gate conductor structures and inorganic semiconducting structures generally provide higher performance (e.g., improved electrical characteristics) as compared to organic electronic devices having laser patterned gate conductor structures. For example, the present invention enables formation of printed inorganic electrical devices having gate line widths below 10 microns, whereas the line width in printed devices utilizing conventional graphic arts printing technology generally is larger than 10 micron. The present invention may be implemented digitally, such that the gate metal pattern is generated continuously from an arbitrary digital data source, and as a result, may be "maskless," easily customizable, and/or locally alignable, which may enable use of flexible substrates and/or substrates which undergo substantial distortion (such as polymer sheets or metal foils). Furthermore, the invention may be implemented using contactless printing techniques (which may reduce or eliminate the impact of defects originating from use of contact printing methods, such as gravure printing, offset printing, etc.), and the invention enables a depth of focus of up to -20 μm). These and other advantages of the present invention will become readily apparent from the detailed description of preferred embodiments below.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

For the sake of convenience and simplicity, the terms "coupled to," "connected to," and "in communication with" (and variations thereof) mean direct or indirect coupling, connection or communication, unless the context clearly indicates otherwise. These terms are generally used interchangeably herein, and wherever one such term is used, it also encompasses the other terms, unless the context clearly indicates otherwise. In the present disclosure, the term "deposit" (and grammatical variations thereof) is intended to encompass all forms of deposition, including blanket deposition, coating, and printing. Furthermore, with regard to certain materials, the phrase "consisting essentially of" does not exclude intentionally added dopants, which may give the material to which the dopant is added (or the element or structure formed from such material) certain desired (and potentially quite different) physical and/or electrical properties. The term "(cyclo)silane" refers to compounds or mixtures of compounds that consist essentially of (1) silicon and/or germanium and (2) hydrogen, and that may contain one or more cyclic rings. The term "hetero(cyclo)silane" refers to compounds or mixtures of compounds that consist essentially of (1) silicon and/or germanium, (2) hydrogen, and (3) dopant atoms such as B, P, As or Sb that may be substituted by a conventional hydrocarbon, silane or germane substituent and that may contain one or more cyclic rings. Also, a "major surface" of a structure or feature is a surface defined at least in part by the largest axis of the structure or feature (e.g., if the structure is round and has a radius greater than its thickness, the radial surface[s] is/are the major surface of the structure; however, where the structure is square, rectangular or oval, the major surface of the structure is typically a surface defined by the two largest axes [generally the length and width]).

The present invention concerns a method of making a MOS transistor, generally comprising the steps of (1) forming a layer of metal-containing material on a dielectric film, wherein the dielectric film is on an electrically functional substrate comprising an inorganic semiconductor; (2) laser patterning a metal gate from the metal-containing material layer; and (3) forming source and drain terminals in the inorganic semiconductor in locations substantially adjacent to the metal gate. In a further aspect, the present invention concerns an electrical device, comprising (a) an electrically functional substrate, (b) a dielectric film on a portion thereof, (c) a laser-patterned metal gate on the dielectric film, and (d) source and drain terminals comprising a (heavily) doped inorganic semiconductor layer on or in the electrically functional substrate, substantially adjacent to the metal gate.

The invention, in its various aspects, will be explained in greater detail below with regard to exemplary embodiments.

An Exemplary Method for Making a MOS Transistor

In one aspect, the present invention concerns a method for making a MOS transistor (preferably a MOS TFT), comprising the steps of (1) forming a layer of metal-containing material on a dielectric film, wherein the dielectric film is on an electrically functional substrate comprising an inorganic semiconductor; (2) laser patterning a metal gate from the metal-containing material layer; and (3) forming source and drain terminals in the inorganic semiconductor in locations substantially adjacent to the metal gate. In a preferred embodiment, the method further comprises depositing a liquid-phase semiconductor (e.g., Group IVA element) precursor on the substrate, then curing and (optionally) annealing the liquid-phase semiconductor precursor to form inorganic semiconductor and/or the source and drain terminals. In one implementation the liquid-phase semiconductor precursor depositing step comprises printing a semiconductor precursor ink on a substrate suitable for TFTs. Printing a liquid-phase ink, as opposed to blanket deposition, photolithography and etching, saves on (i) the number of processing steps, (ii) the length of time for the manufacturing process, (iii) the cost of manufacturing a circuit, chip, display element, photosensitive element or other apparatus having the present MOS transistor thereon and/or (iv) the setup time that it would typically take to modify or alter the pattern of a patterned silicon layer, which would conventionally involve a labor-intensive and relatively expensive mask change. Thus, the present method provides a cost-effective method for manufacturing fast, reliable electronic devices, such as MOS transistors, at higher throughput than conventional MOS semiconductor process technology TFTs capable of operating at GHz frequencies may require (1) narrow channel widths, (2) source and drain terminals that are self-aligned to the gate with a small amount of overlap between, and (3) high carrier mobility. A laser (e.g., a conventional computer to plate [CTP] printing tool used in modern offset or gravure printing one or more capabilities of which may be modified or optimized for flat bed/plate printing [for example, in which the auto-focus and multi-layer alignment/registration capabilities may be optimized towards flat bed/plate printing, and thus modified from those optimized for offset or gravure printing] and which may be used to form a pattern in a resist on a metal foil or cylinder to form ink wells that are subsequently pressed against paper or another substrate to print the ink on the substrate) can be used to write relatively narrow transistor gates on the order of 5 microns wide, with widths below 2 microns being obtainable using resist masking and wet undercut etching.

In a further embodiment of the invention, self aligned source and drain terminals may be produced using a combination of "liquid silicon" ink formulations and Excimer laser exposure of active areas. Improved carrier mobility (e.g., resulting from dopant activation) may be provided by metal induced or furnace crystallization and/or the energy from the Excimer laser. One advantage from using an Excimer laser is that it can generate very high temperatures in very confined locations, a capability that is very useful for activating semiconductor dopants in patterned films without significant adverse thermal effects elsewhere in the circuit, chip, element, apparatus or underlying films and/or substrates.

An exemplary process flow for making a thin film transistor in accordance with the present invention includes the following steps:

Deposit lightly doped silane to form an amorphous Si thin film (Optional) Deposit metal seed layer (Optional) Dehydrogenate amorphous Si Crystallize lightly doped or undoped amorphous Si (e.g., by Excimer laser treatment, or by furnace treatment)

Deposit, grow or otherwise form gate oxide

Write or otherwise pattern gate metal

Etch gate oxide using gate as a mask

Deposit thin, heavily doped silane (or a solid dopant source, or implant dopant)

Activate and/or diffuse dopants in heavily doped areas (e.g., by Excimer laser treatment)

Figure 4:
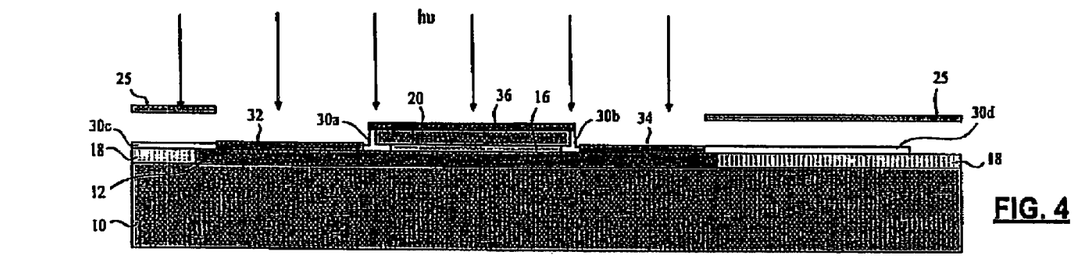

If (cyclo)silane is used, selectively wet etch non-irradiated (insufficiently crystallized, activated or otherwise affected) doped amorphous Silicon from gate sidewall (see, e.g., FIG. 4)

Write dielectric if metal crossovers (e.g., second level metal) are needed (optional)

Write source and drain contact metal

Deposit passivation (e.g., oxide or nitride)

Conventional annealing

Hydrogenation (optional)

Testing (optional)

The present process can be integrated to form both p- and n-channel transistors. In one example, conventional ion implantation with sources of P and B, respectively, in combination with conventional mask and etch techniques, is used to form high performance p- and n-channel transistors. More preferably, one may use silane compositions containing different dopant types in one or more of the doped silane depositing steps above. For example, different inks containing different dopant types and concentrations can be printed in different areas of the substrate. A first exemplary method for manufacturing the present MOS transistor is described below with reference to FIGS. 1-5.

Forming the Gate Metal Layer

Figure 1:
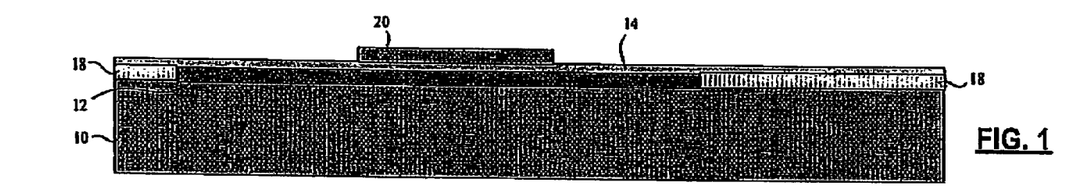
FIGS. 1-5 show cross-sectional views of a MOS device at various stages of an exemplary embodiment of the present method, FIG. 5 showing a cross-sectional view of a substantially complete MOS TFT device.

Referring now to FIG. 1, which shows a cross-sectional view of a MOS TFT device precursor, the method may comprise the step of laser patterning a gate metal layer 20 on a gate dielectric layer 14. In turn, gate dielectric layer 14 is on lighty doped (electrically active) polysilicon layer 12, which is coated or otherwise formed on substrate 10 and which may be bordered by (electrically) inactive silicon-containing regions 18. In various embodiments, gate metal layer 20 may be formed by blanket depositing a metal or metal-containing material, or printing a metal precursor material, onto dielectric layer 14, then "laser patterning" the metal gate. As envisioned herein, laser patterning encompasses (i) irradiating a thermal resist (similar to that used in CTP/digital printing plate chemistries), (ii) irradiating a conventional resist material further containing a UV, visible or IR dye therein, and (iii) directly irradiating, or "laser writing," a metal precursor ink (i.e., a composition comprising a metal precursor in a solvent) deposited onto dielectric layer 14, then (optionally) developing and/or annealing the patterned ink layer.

In one embodiment, blanket deposition may comprise, e.g., evaporation, physical vapor deposition, sputtering, or chemical vapor deposition, as is known in the art. Alternatively, blanket deposition may comprise spin-coating a nanoparticle ink comprising metal nanoparticles (which may be passivated) and a solvent, and curing the nanoparticle ink (see, e.g., U.S. Pat. No. 6,878,184, the relevant portions of which are incorporated herein by reference). Metals that may be deposited by such methods include elemental metals, such as aluminum, titanium, vanadium, chromium, molybdenum, tungsten, iron, nickel, palladium, platinum, copper, zinc, silver, gold, etc.; conventional alloys of such elements, such as aluminum-copper alloys, aluminum-silicon alloys, aluminum-copper-silicon alloys, titanium-tungsten alloys, aluminum-titanium alloys, etc.; and electrically conductive metal compounds, such as the nitrites and silcides of elemental metals (e.g., titanium nitride, titanium silicide, tantalum nitride, cobalt silicide, molybdenum silicide, tungsten silicide, platinum silicide, etc). In other embodiments, the blanket depositing step may comprise spin-coating an ink containing the metal-containing material, the metal-containing material may comprise metal nanoparticles and/or organometallic precursors of one or more of the metals disclosed above, and/or the method may further comprise the step of curing or annealing the metal, organometallic precursor(s) and/or metal nanoparticles before the step of laser patterning.

In certain embodiments, laser patterning may comprise the substeps of depositing a resist material on the blanket deposited metal-containing layer, selectively irradiating portions of the resist material with a beam of light from a laser having (i) a predetermined width and/or (ii) a predetermined wavelength or wavelength band absorbed by the resist (or by an absorptive dye in the resist), developing the selectively irradiated resist with a developer to leave a pattern corresponding to the structure being formed (in this case, gate metal 20; note that these steps apply to both positive and negative resist), removing those portions of the blanket deposited material not corresponding to the desired or predetermined pattern (typically by dry or wet etching), and removing the remaining resist material. Preferably, the light has a wavelength in the infrared (IR) band (although it could also comprise a wavelength or wavelength band in the ultraviolet [UV] and/or visible band of the spectrum), the resist (or dye) absorbs and/or is sensitive to that wavelength or band of light, and the light beam is focused on or directed at the desired or predetermined portions of the resist.

In one alternative, a thermal resist may be advantageously used to mask the gate metal. Irradiation of the thermal resist with a relatively narrow laser beam (e.g., 2-5 μm wide, or by passing more diffuse light through a mask configured to define structures of such width) from a laser heats the resist and changes its solubility characteristics in a conventional developer that is used to remove the irradiated (written) or non-irradiated (unwritten) portions of the resist, depending on whether the resist is positive- or negative-acting, respectively. Such resist are generally available commercially from Creo Inc., Burnaby, British Columbia, Canada. Preferred thermal resists include Gravity Thermal Resist (Creo) and the American Dye Sources Thernolak series. The resist may also comprise a conventional (photo)resist material having an infrared (IR) light-absorbing dye therein. Preferred (photo) resists include AZ1518 (AZ Electronic Materials) and SPR220 (Shipley), and preferred infrared (IR) light-absorbing dyes include American Dye Source 815EI, 830AT, 830WS and 832WS, Avecia Projet 830NP and 830 LDI, Epolin Epolight 4148, 2184, 4121, 4113, 3063 and 4149, HW Sands SDA5303 and SDA4554. After development, metal (or metal precursor) material outside of the (predetermined) gate pattern may be removed by wet or dry etching. Wet etching may also advantageously undercut the resist to provide an even narrower gate and/or transistor channel width than would be possible using dry etching.

In a further alternative, the gate metal layer may be defined by "laser writing" or "laser direct writing." In the case of laser writing gate metal, a metal precursor ink, such as a metal nanoparticle ink, may be blanket-deposited or printed as described herein (but not cured), then irradiated (written) with a laser (e.g., by producing an optical irradiation beam about 2-10 μm wide, or by passing laser irradiation through a mask configured to define structures of such width, the light having a IR, visible or UV wavelength or bandwidth that is absorbed by the metal precursor, nanoparticles or other materials in the ink). The light heats (and subsequently cures, cross-links or fuses) the metal precursor, and the non-irradiated (unwritten) portions of the deposited ink can be removed in a developer (sometimes comprising a solvent similar or identical to the solvent used in the precursor ink). Laser direct writing of gate metal (e.g., generally according to the procedure for forming conductive metal wires or films as disclosed in U.S. patent application Ser. No. 10/722,255, filed on Nov. 24, 2003, the relevant portions of which are incorporated herein by reference) is generally preferred, for cost and manufacturing throughput considerations. Alternatively, the metal precursor ink may comprise one or more photodefinable metal-containing species in which absorption of UV, visible or IR irradiation directly or indirectly induces changes (e.g., a chemical reaction in one or more moieties of the ligand shell surrounding a metal nanoparticle) sufficient to change the solubility characteristics thereof in a subsequently-used developer.

Thus, in "laser (direct) writing," when irradiation causes the metal precursor to cure, cross-link and/or fuse, the non-irradiated portions of the metal precursor ink may be developed with a solvent or solvent mixture that selectively removes or dissolves non-irradiated ink without affecting the irradiated portions of the ink. Alternatively, when a resist with photolytically or thermally induced solubility changes is used, either the non-irradiated (negative) or the irradiated (positive) areas can be developed. Inks containing metal precursors that have substantially different electrical and solubility properties after irradiation (so-called "radiation patternable functional materials") are disclosed in copending U.S. patent application Ser. Nos. 10/722,255 and 10/749,876 , respectively filed on Nov. 24, 2003 and Dec. 31, 2003, the relevant portions of which are incorporated herein by reference. An additional annealing step (after developing) at a temperature of from 100 to 300° C. for a time of from 1 to 60 min. in an oxidizing, reducing or inert atmosphere may be advantageous to improve the metal resistively, line profile and/or morphology, the adhesion of the metal to the underlying dielectric, and/or to reduce the amount of impurities in the patterned metal gate. Suitable inert atmospheres may include one or more oxygen-free inert gases, such as nitrogen and the noble gases (e.g., He, Ne, Ar, Kr, and/or Xe). Suitable reducing atmospheres may include forming gas, ammonia, methane, silane, phosphine, hydrogen, a borane, etc., optionally with one or more oxygen-free inert (e.g., carrier) gases as described herein.

Thus, in various embodiments of the present method, the metal-containing material comprises metal nanoparticles and/or one or more organometallic compounds, any of which may be sensitive to irradiation, and may further comprise a solvent (e.g., to form an ink). Where the metal-containing material comprises metal nanoparticles, the laser writing step may comprise irradiating the metal nanoparticles sufficiently to cure, link or fuse the metal nanoparticles to each other. Where the metal-containing material comprises a photodefinable metal-containing species (e.g., photodefinable metal nanoparticles or a photodefinable organometallic compound), the laser writing step may comprises irradiating the photodefinable metal-containing species sufficiently to change the solubility characteristics thereof in a subsequently-used developer. In a preferred embodiment, the photodefinable metal-containing species comprises metal nanoparticles with ligands bound thereto, the ligands containing a photoreactive group or a group that is reactive with a photochemically generated species and that, after first-order photoreaction or reacting with the photochemically generated species, materially changes the solubility characteristics of the metal-containing material in a developer. In such embodiments, the method may further comprise the step of removing unwritten metal-containing material (e.g., with the developer), but in certain cases, the unwritten material (or, alternatively, the irradiated or written area in a positive resist formulation) may be relatively electrically insulative, and need not necessarily be removed.

In one variation, the metal-containing material may be irradiated as described above, but the change in its solubility characteristics is initiated or caused by heat. In such an embodiment, the heat may be generated by a dye, nanoparticles or a "thermally reactive group" in an initiator or in a ligand bound to the metal-containing species absorbing the radiation. In other words, laser patterning in such an embodiment may comprise irradiating portions of a material adapted to define the metal gate pattern (such as a resist or metal-containing material having a UV, visible or IR dye, and/or other thermally reactive material, therein), thereby heating the irradiated material and changing its solubility characteristics, and (optionally) developing and/or annealing the irradiated material. Thus, the metal-containing material may further contain one or more photosensitive or thermally sensitive initiators. In one embodiment, irradiating and heating occur substantially simultaneously. In such a case, a dye absorbs light during the irradiating step and converts the absorbed light to heat energy, which causes the thermally reactive material to react and change solubility characteristics of the gate metal-defining material. Alternatively, irradiating and heating may be performed in separate steps. For example, laser irradiation of a reactive species in the metal-containing material may generate a pattern in the metal-containing material, then subsequent heating (e.g., on a hotplate or in an oven or furnace) is conducted to change the solubility characteristics of the material.

For example, metal nanoparticles having a ligand carrying a vinyl group (e.g., at the end; a so-called "ω-olein") may be formulated into an ink, further containing a conventional radical initiator (e.g., AIBN) and a surfactant. The ink may be deposited and laser irradiated at significantly lower powers than for direct laser conversion of the nanoparticles to metal, and the absorbed heat initiates a radical polymerization of the vinyl groups in the surfactant. Suitable nanoparticles having such vinyl group-containing ligands, radical initiators and surfactants, as well as (1) other ligands having radical-based, thermally cross-linkable groups and/or (2) ink formulations that can be prepared using such nanoparticles, initiators and surfactants, are disclosed in copending U.S. application Ser. No. 10/749,876, filed Dec. 31, 2003 , the relevant portions of which are incorporated herein by reference.

Alternatively, a metal-containing ink may be printed onto dielectric layer 14 by essentially any conventional printing technology. For example, printing may comprise inkjet printing ("inkjetting"), screen printing gravure printing, offset printing flexography (flexographic printing), spray-coating slit coating, extrusion coating, meniscus coating, microspotting, pen-coating, stenciling, stamping, syringe dispensing and/or pump dispensing the metal-containing ink in a predefined pattern onto dielectric layer 14. The ink may comprise or consist essentially of the metal precursor material and a solvent. The metal precursors that are generally compatible with printing (or [selectively] plating onto a printed or laser written conductor or semiconductor precursor) may comprise organometallic compounds or nanoparticles (e.g., nanocrystals) of a metal such as titanium, copper, silver, chromium molybdenum, tungsten, cobalt, nickel, gold, palladium, platinum, zinc, iron, etc., or metal alloys thereof, preferably silver or gold (or a metal alloy thereof). Such nanoparticles or nanocrystals may be conventionally passivated (e.g., with one or more surfactants) or unpassivated. Plating may comprise, in one example, laser writing a seed layer of metal (e.g., Pd) using nanoparticles or an organometallic compound of the metal, then selectively depositing (e.g., by electroless or electroplating) a bulk conductor (e.g., Co, Ni, Cu, etc.) or semiconductor (e.g., Si and/or Ge) onto the laser written metal layer. Alternatively, the ink may comprise or consist essentially of a conventional paste comprising a powder of one or more such metals or alloys thereof in a conventional binder.

Thus, the metal-containing material layer forming step in the present method may comprise printing a metal-containing ink onto the dielectric film. In such a process, the method may further comprise laser patterning, curing and/or annealing the metal-containing ink. In the case where a metal-containing ink is printed onto the dielectric film before laser irradiation, the amount of metal or metal precursor material used or consumed is significantly reduced. In the case where a metal-containing ink is first printed, then laser patterned, the combination of printing and laser patterning significantly reduces the amount of metal or metal precursor material used or consumed, while still providing the high resolution of laser patterning (relative to graphic arts printing technology). Where printing is followed by laser writing (e.g., direct irradiation of the metal or metal precursor material from the ink), the steps of resist deposition and removal are avoided (in comparison to blanket deposition followed by laser writing), in addition to the other advantages described herein.

Whether printed or blanket-deposited, the metal-containing ink may be dried by conventional and/or otherwise known processes. For example, metal precursor inks may be dried by heating the substrate 10 containing the printed metal precursor ink thereon at a temperature and for a length of time effective to remove the solvent and/or binder. Suitable temperatures for removing solvents from a printed ink may range from about 80° C. to about 150° C., or any range of temperature therein (e.g., from about 100° C. to about 120° C.). Suitable lengths of time for removing solvents from a printed ink at such temperatures may ranges from about 10 seconds to about 10 minutes, or any range of times therein (e.g., from about 30 seconds to about 5 minutes, or about 1 minute to 3 minutes, etc.). Such heating may take place on a conventional hotplate or in a conventional furnace or oven, optionally in an inert atmosphere (as described above).

Also, whether printed or blanket-deposited, the dried metal-containing material from the ink may be further annealed at a temperature and for a length of time sufficient to improve its electrical and/or physical properties (e.g., conductivity, morphology, electromigration and/or etch resistance, stress and/or surface strain, etc.) and/or its adhesion to the underlying gate oxide. When the metal-containing ink is globally (blanket) deposited or printed, annealing is generally conducted to form a metal film on which a resist is deposited for subsequent laser patterning. Also, when laser direct-writing a metal precursor ink results in a patterned metal and/or metal precursor, annealing is generally performed to form a metal layer with improved conductivity, adhesion etc. Such annealing may comprise either annealing of already-fused metal nanoparticles, or converting a patterned metal precursor layer into a patterned metal. Suitable temperatures generally range from about 100° C. to about 300° C., or any range of temperatures therein (e.g., from about 150° C. to about 250° C.). Suitable lengths of time for annealing may range from about 1 minute to about 2 hours, preferably from about 10 minutes to about 1 hour, or any range of times therein (e.g., from about 10 to about 30 minutes). Annealing may be conducted in a conventional furnace or oven, optionally in an inert or reducing atmosphere (as described above). Thus, the present method may further comprise the step of annealing the laser patterned metal gate sufficiently to improve its electrical, physical and/or adhesive properties.

Forming the Underlying Transistor Channel Layer

The present method may further comprise the steps off forming dielectric layer 14 and/or form transistor channel (preferably, semiconductor) layer 12. In one embodiment, semiconductor layer 12 may be formed by techniques similar to those used to blanket-deposit the gate metal 20, but using conventional semiconductor (or semiconductor precursor) materials for blanket deposition. As is known in the art, conventional blanket deposition may comprise chemical vapor deposition (CVD), low pressure CVD, sputtering or other physical vapor deposition (PVD) technique, spin coating, spray coating, etc. Preferably, such blanket deposition comprises CVD of a silane (e.g., $SiH_4$) and/or germane (e.g., $GeH_4$). The blanket-deposited semiconductor layer 12 may be lightly doped, e.g., by conventional ion implantation or other doping technique described herein (and optionally, subsequent annealing). Active transistor regions (e.g., an area of semiconductor layer 12 that is substantially defined by the outermost borders of the overlying source, drain and gate 32, 34 and 36; see, e.g., FIG. 6) may be defined thereafter by conventional photolithography and etching. The term "Group IVA semiconductor" refers to a semiconductor that contains primarily silicon and/or germanium.

Alternatively, semiconductor (transistor channel) layer 12 may be formed by printing or coating the substrate 10 with a doped or undoped semiconductor ink while simultaneously irradiating the ink/substrate. In one implementation, the process comprises spin-coating the ink containing a semiconductor precursor onto substrate 10, while irradiating the ink with ultraviolet light during a substantial part of the spin-coating step. This technique (which, in the latter implementation, is sometimes known as "UV spin-coating") is described in greater detail in copending U.S. patent application Ser. No. 10/789,274, filed on Feb. 27, 2004, the relevant portions of which are incorporated herein by reference. In another implementation, printing (which may include simultaneous or immediately subsequent UV irradiation) comprises inkjetting or gravure, flexographic, screen or offset printing a doped or undoped semiconductor ink in locations on the substrate corresponding to active transistor regions (or other deposition technique for depositing material in selected areas of the substrate 10). In either case, semiconductor layer 12 generally has an amorphous morphology following deposition with substantially simultaneous irradiation, and before further processing, it is generally crystallized (e.g., by heating or by laser irradiation; see, e.g., U.S. patent application Ser. Nos. 10/950,373 and 10/949,013, each of which was filed on Sep. 24, 2004, the relevant portions of which are incorporated herein by reference). In many cases, such crystallization will also activate at least some of the dopant.

Thus, in one case, the printed region (generally including laser-irradiated, at least partially polycrystalline region 12 and, to the extent present, non-irradiated region[s] 18) is not necessarily co-extensive with the (partially) polycrystalline region 12. Generally, the printed regions are larger than the irradiated regions that form polycrystalline (and, preferably, electrically active) thin film 12; thus, there may be some amorphous (and/or electrically inactive) film regions 18 substantially adjacent to thin film 12. However, in either case (blanket deposition or printing of semiconductor layer 12), one may use photolithographic masking/patterning and etching to define the active semiconductor regions ("islands"). Printing in this embodiment, may constitute inkjetting a silane ink in a relatively large region (in one example, about 5 $mm^2$), then using conventional photolithography for higher resolution patterning (i.e., where the photolithographically patterned region has a smaller area than the corresponding printed region).

In a preferred embodiment, semiconductor layer 12 comprises lightly doped silicon (e.g., silicon having a dopant concentration of from about $10^{16}$ to about $5 \times 10^{18}$ atoms/$cm^3$). Compositions (e.g., ink formulations) providing a lightly doped silicon layer 12 using the "UV spin-coating" or "UV inkjetting" process are described in greater detail in copending U.S. patent application Ser. Nos. 10/950,373 and 10/949,013, each of which was filed on Sep. 24, 2004, the relevant portions of which are incorporated herein by reference. Alternatively, semiconductor layer 12 (e.g., silicon)

may be lightly doped by one or more conventional techniques, such as ion implantation, ion shower, spin-on-dopant(s), etc.

Dielectric layer 14 may be formed by conventional deposition (e.g., blanket deposition as described above) of a conventional or high dielectric constant dielectric material (e.g., silicon dioxide, silicon nitride, a silicon oxynitride, a borosilicate glass [BSG], a phosphosilicate glass [PSG], a borophosphosilicate glass [BPSG], a fluorosilicate glass [FSG], aluminum oxide, titanium oxide, tantalum oxide etc.), or by conventional thermal wet or dry growth of an oxide of the element(s) in semiconductor layer 12/18 (e.g., thermal silicon dioxide). Alternatively, blanket deposition or printing of dielectric layer 14 may comprise coating the semiconductor layer 12/18 with a liquid-phase ink composition comprising a chemical dielectric material precursor and/or particles of dielectric material. For example, an ink containing a dielectric material or dielectric precursor (a "dielectric ink") may be spin coated, inkjetted, gravure-printed, offset-printed, flexo-printed, dip-coated, spray-coated, slit coated, extrusion coated, or meniscus coated onto the semiconductor layer 12/18. Alternatively, the dielectric ink may be printed or laser written in a pattern corresponding to the transistor active regions onto semiconductor layer 12. Printable and/or UV-writable dielectric inks are also disclosed in copending U.S. application Ser. No. 10/749,876, filed Dec. 31, 2003 , the relevant portions of which are incorporated herein by reference.

Etching the Gate Dielectric Layer

In a further aspect of the invention, the present method may comprise etching exposed portions of the gate dielectric layer 14 (i.e., that are not covered by gate metal 20). Such etching may comprise conventional wet or dry etching, using an etchant or etchant mixture that selectively etches the gate dielectric layer 14 relative to gate metal 20 and semiconductor layer 12. Wet and dry etchants and etchant mixtures (and conditions for such selective etching, whether wet or dry) that selectively etch dielectrics such as silicon dioxide, PSG, BPSG, and aluminum oxide relative to commonly used metals (such as aluminum, titanium, molybdenum, tungsten, silver, gold, platinum, palladium, nickel, cobalt, etc.) and known semiconductor materials (such as silicon and silicon-germanium) are well known and/or can be determined from known etchants using routine experimentation.

Figure 2:
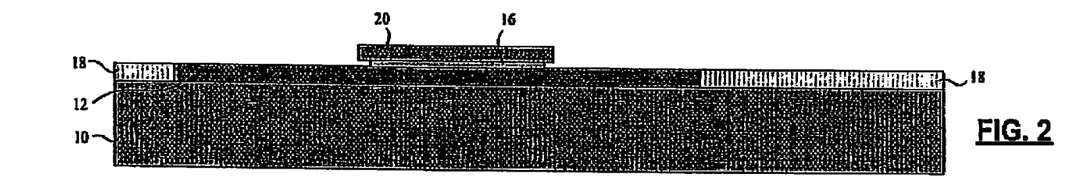

Exposed portions of the gate dielectric layer 14 and portions or gate dielectric layer 14 under the periphery of gate metal 20 (a so-called "undercut" region) may be removed by conventional wet etching to gate dielectric 16, as shown in FIG. 2. For example, when the gate dielectric layer 14 consists essentially of silicon dioxide (i.e., $SiO_2$ that may be doped with up to 2-4 at. % of conventional boron, phosphorous and/or fluorine dopant atoms, relative to silicon atoms), semiconductor layer 12 consists essentially of n⁻-doped silicon, and gate metal 20 may consist essentially of silver or gold, the wet etchant comprises or consists essentially of conventional ammonia-buffered aqueous HF (e.g., aqueous $NH_4F$), as is known in the art.

Forming the (Heavily) Doped Layer

Figure 3:
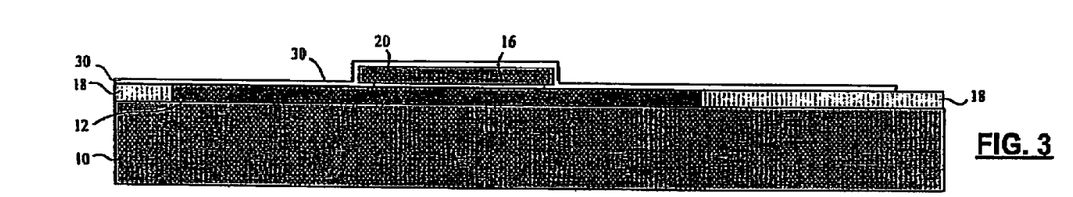

The steps in the present method that form the source and drain layers (see, e.g., structures 32 and 34 in FIG. 4) may be formed conventionally and/or as explained in copending U.S. application Ser. No. 11/084,448, filed on Mar. 18, 2005 , the relevant portions of which are incorporated herein by reference. Referring now to FIG. 3, and explained in U.S. application Ser. No. 11/084,448 , a semiconductor layer 30 may be deposited onto gate metal 20 and exposed portions of semiconductor layer 12, preferably by printing or coating, with at least partly and/or substantially simultaneous (UV) irradiation, as described in copending U.S. application Ser. No. 10/789,274, filed on Feb. 27, 2004 , the relevant portions of which are incorporated herein by reference.

The semiconductor layer 30 preferably comprises a doped semiconductor ink formulation as disclosed in copending U.S. patent application Ser. Nos. 10/950,373, 10/949,013 and 10/956,714 , IDR0302 and IDR0303), respectively filed on Sep. 24, 2004, Sep. 24, 2004 and Oct. 1, 2004 and respectively entitled "Heterocyclic Semiconductor Precursor Compounds, Compositions Containing the Same, and Methods of Making Such Compounds and Compositions," "Methods of Forming a Doped Semiconductor Thin Film, Doped Semiconductor Thin Film Structures, Doped Silane Compositions, and Methods of Making Such Compositions," and "Dopant Group-Substituted Semiconductor Precursor Compounds, Compositions Containing, the Same, and Methods of Making Such Compounds and Compositions" the relevant portions of which are incorporated herein by reference. Such formulations may comprise (1) a Group IVA atom source, (2) a dopant source, and (optionally) a solvent in which the Group IVA atom source and dopant source are soluble. The Group IVA atom source and dopant source may comprise, include or consist essentially of a single chemical species (such as a hetero[cyclo]silane) or plural chemical species (such as a [cyclo]silane and an organophosphine, silylphosphine, organoborane or siylborane), In one implementation, the Group IVA atom source and dopant source are liquids at ambient temperatures (e.g., from about 15° C. to about 30° C.).

Representative cyclosilane compounds of the formula $(AH_z)_k$ and an exemplary method for their preparation are described in greater detail in copending application Ser. No. 10/789,317, filed Feb. 27, 2004 , the relevant portions of which are incorporated herein by reference. Representative hetero(cyclo)silane compounds, exemplary methods for their preparation, and techniques for determining and/or controlling the dopant levels in the precursor inks and active films are described in greater detail in copending application Ser. Nos. 10/950,373, 10/949,013 and 10/956,714 , respectively filed on Sep. 24, 2004, Sep. 24, 2004 and Oct. 1, 2004, the relevant portions of which are incorporated herein by reference.

Typically, although not necessarily always, liquid-phase semiconductor inks further comprise a solvent, preferably a cycloalkane. Thus, when using an ink comprising or consisting essentially of a Group IVA element source (such as a silane-based precursor to Si or doped Si), forming the semiconductor layer 30 may further comprise drying the liquid-phase precursor ink after deposition. See copending U.S. application Ser. Nos. 10/616,147, 10/789,317 and 10/789,274, respectively filed Jul. 8, 2003, Feb. 27, 2004 and Feb. 27, 2004 , respectively), the relevant portions of each of which are incorporated herein by reference.

After deposition (and generally, at least some drying), semiconductor layer 30 is generally cured by heating, as described above in copending U.S. patent application Ser. No. 10/789,274 , filed on Feb. 27, 2004, the relevant portions of which are incorporated herein by reference) to form an amorphous, hydrogenated silicon (a-Si:H) layer. When semiconductor layer 30 originates or is formed from a (cyclo)silane and/or hetero(cyclo)silane, the curing/heating step may remove unwanted precursor/ink components or byproducts such as volatile carbon-containing species or reduce the hydrogen content of the a-Si:H layer (which is particularly advantageous if laser crystallization is to be used after semiconductor film formation). When semiconductor layer 30 originates or is formed from a hetero(cyclo)silane, the curing/heating step may also activate part of the dopant in the hetero (cyclo)silane.

Also, the semiconductor layer 30 may be deposited by local printing of the liquid semiconductor precursor ink directly onto gate metal 20 and semiconductor layer 12 (see, e.g., copending U.S. patent application Ser. No. 10/949,013, filed on Sep. 24, 2004, the relevant portions of which are incorporated herein by reference). This latter approach to forming MOS TFT structures may be cost effective due to (i) the efficient usage of the semiconductor precursor materials and (ii) the combination of semiconductor deposition and patterning into one printing step.

Forming Self-Aligned Source and Drain Terminals

As shown in FIG. 4 and explained in U.S. application Ser. No. 11/084,448, a-Si:H layer 30 may be irradiated, preferably with light from an Excimer laser, through a mask 25 to change the morphology of (e.g., crystallize) at least portions 32 and 34 of a-Si:H layer 30 that are arranged or configured to absorb the UV light. In addition, such irradiation may also activate some or all of the dopant in the irradiated portions of a-Si:H layer 30. Semiconductor layer portions 32 and 34 generally correspond to the source and drain regions of the TFT. Consequently, portions 32 and 34 are preferably heavily doped (e.g., they contain a dopant concentration of from about $10^{19}$ to about $10^{21}$ atoms/cm$^3$). Ink formulations providing heavily doped materials are described in greater detail in copending U.S. patent application Ser. No. 10/950,373, filed on Sep. 24, 2004, the relevant portions of which are incorporated herein by reference, and processes for forming a layer of such a heavily doped semiconductor by curing and irradiating a thin film formed from such doped ink formulations are described in greater detail in copending U.S. patent application Ser. No. 10/949,013, filed on Sep. 24, 2004, the relevant portions of which are incorporated herein by reference.

Doped layer portion 36, which is shown on gate metal layer 20, generally comprises the same doped material as that of doped layer portions 32 and 34. However, depending on the thickness of the gate metal, doped layer portion 36 may not be heated sufficiently by the laser to crystallize the doped material and/or to electrically activate some or any amount of dopant therein. As a result, doped layer portion 36 may be removed in any subsequent step at selectively and/or effectively removes non-irradiated (e.g., amorphous) portions of a-Si:H material 30. Alternatively or additionally, and depending somewhat on the metal in gate metal 20 and the laser crystallization conditions, atoms in doped layer portion 36 may react with metal atoms in gate metal 20 to form a metal silicide. In any case, to the extent that it is present, doped layer portion 36 is generally not believed to be electrically functional, or at least not sufficiently electrically functional to change or affect the electrical properties of the gate metal 20 or to interfere with the intended use of layer 20 as a gate.

The non-irradiated portions 30a and 30b of a-Si:H layer 30 (e.g., spacers 30a and 30b on the sidewall of gate metal 20) may be selectively removed (along with masked portions 30c and 30d of a-Si:H layer 30). For example, when laser irradiation crystallizes semiconductor layer portions 32 and 34, non-irradiated a-Si:H portions 30a and 30b may be etched selectively to gate metal 20, gate oxide 16 and the crystallized semiconductor regions 32 and 34. Masked portions 30c and 30d, along with exposed portions of amorphous semiconductor region(s) 18, may also be removed in such a selective etching step. As is known in the art, decoration wet etches have been used for many years in traditional semiconductor processing to accomplish such a result (e.g., selective removal of hydrogenated, amorphous silicon without significant removal of polycrystalline silicon). However, whether removed or retained, non-irradiated portions 30a and 30b of a-Si:H layer 30 (in combination with gate semiconductor layer 36) provide a useful function for automatically aligning source/drain contact layers 32 and 34 to gate metal 20, with a small offset. Typically, this offset is about the same as the thickness of the a-Si:H layer 30.

The (doped) a-Si:H may be deposited to a thickness sufficient to result in a layer about 50-200 Å thick (preferably about 70-150 Å thick, and in one example, about 100 Å thick). Multiple layers may be deposited as well, to the extent that a particular thickness and/or film morphology may be obtained and/or optimized by use of more than one doped and/or undoped a-Si:H layer. A balance between thickness of the deposited layer 30 and the choice of metal for gate metal layer 20 may be considered. For example, doped layer 30 may absorb sufficient radiation during dopant activation that the gate metal might get too hot and cause electrical failures (e.g., recrystallize or react with chemical species from surrounding structures, form whiskers or hillocks, or start to melt). One may compensate for this phenomenon by either (1) making the gate out of a material that can absorb the heat from silane without causing subsequent electrical failures (such metals being known to those skilled in the art, including tungsten, cobalt, etc.), or (2) forming layer 30 sufficiently thin to reduce the total amount of heat generated by absorption of the light. In this latter case, the doped silicon and/or germanium in the source/drain regions will still absorb sufficient radiation/energy to activate dopant atoms therein, but the gate may be made out of a reflective metal (like Al), so which will conduct heat away from the doped silane/silicon without absorbing significant heat energy from the doped silicon (or radiation that may pass through the doped silane/silicon), thereby reducing the likelihood of heat-related mechanical or electrical failures.

Alternatively, source and drain terminals similar to semiconductor layer portions 32 and 34 may be formed by conventional chemical vapor deposition (CVD; e.g., plasma-enhanced CVD) of a silane semiconductor precursor material such as $Si_xH_y$ and/or $Ge_xH_y$ (x generally being an integer of from 1 to 4 [e.g., 1 or 2], and y=2n+2). For example, dopant may be added to semiconductor layer 12 conventionally to form a conventional channel region and/or source/drain terminals there by conventional ion implantation, ion shower or by use of conventional spin-on-dopants. For example, the present method may further comprise depositing a doped spin-on glass (SOG) on the semiconductor layer 12, or conventionally implanting and/or showering ions into the semiconductor layer 12 (using $POCl_3$, for example), followed by a conventional annealing step to diffuse and/or activate the dopant ions. Similar to semiconductor layer portions 32 and 34 (the source and drain contact portions) some or all of the dopant may be activated by conventional curing and/or annealing, or as described in U.S. patent application Ser. No. 10/949,013. Such doping will probably also introduce ions into gate material 20, but such gate doping is not expected to have any significant effect on the electrical properties of the gate.

Forming Transistor Terminal Conductors and Passivating the Device

Figure 5:
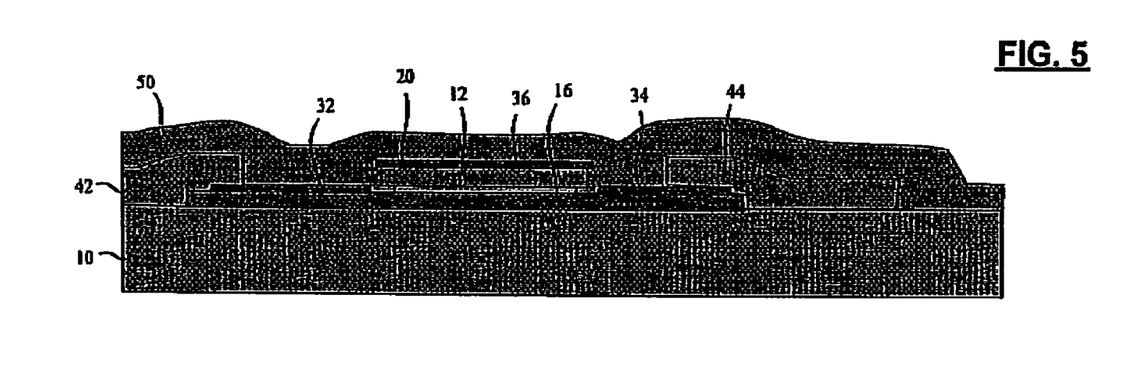

As shown in FIG. 5, after removing non-irradiated semiconductor precursor portions 30a, 30b, 30c and 30d, the present method may further comprise the step(s) of (1) forming conductors 42 and 44 to at least the source and drain terminals 32 and 34 of the TFT, and/or (2) passivating (e.g., forming a passivation layer 50 over) the conductors 42 and 44 and the gate (e.g., gate metal layer 20 and/or gate semiconductor layer 36). To the extent they are exposed, portions of source and drain terminals 32 and 34, semiconductor layer 12 and substrate 10 may also be passivated. Conductors 42 and 44 (and, optionally, a conductor 46 in contact with gate 20/36; see, e.g., FIGS. 6-7) may be formed by any of the methods described above for gate metal 20. However, due to the known chemical reactivity (doped) semiconductors (such as silicon) and certain metals (such as aluminum, titanium, molybdenum, tungsten, cobalt, platinum, etc.), one may interpose a known barrier material (such as titanium nitride) between the conductors (e.g., 42, 44 and 46) and the doped semiconductor (e.g., source, drain and gate layers 32, 34 and 36). Alternatively, conductors 42 and 44 (and, optionally, conductor 46) may consist essentially of or comprise a low layer of, a metal that does not appreciably with the source/drain terminal films 32 and 34 (e.g., Au, Ag) or a metal-silicon compound or alloy (e.g., platinum silicide, palladium silicide, cobalt silicide; titanium silicide, molybdenum silicide, tungsten silicide, Al width about 1 at. % Si therein, etc.).

Figure 6:
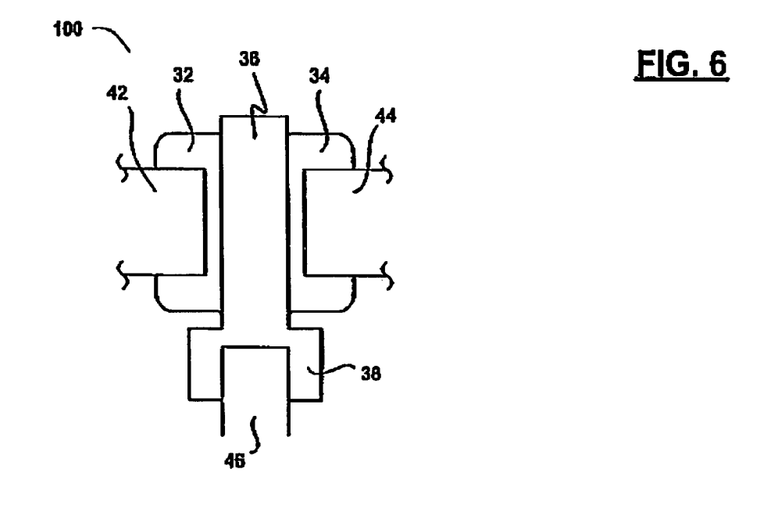
FIG. 6 shows a top-down view of the electrically active components of the MOS TFT device 100 of FIG. 5, without the topmost passivation layer.
Figure 7:
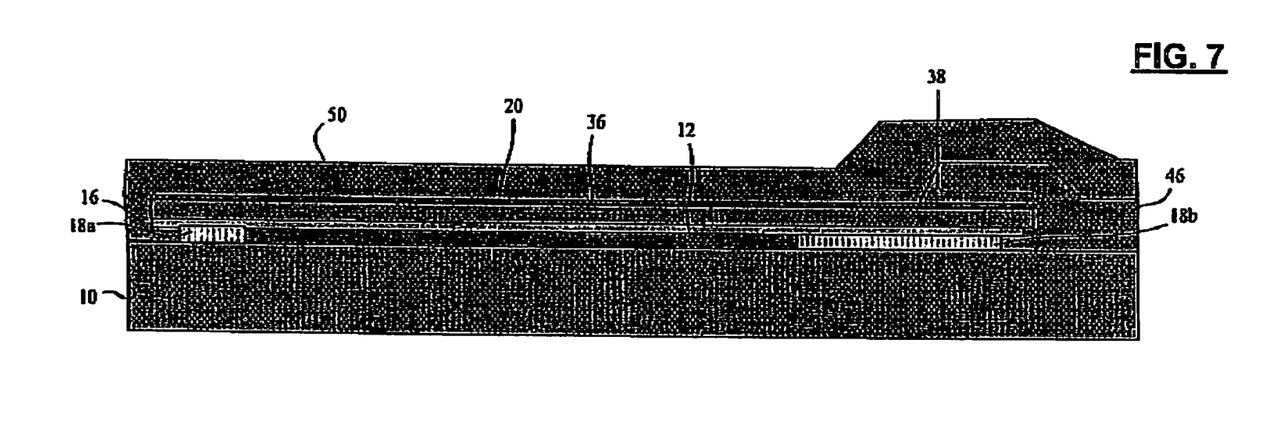
FIG. 7 shows a cross-sectional view of the MOS TFT device of FIGS. 5-6, along the long axis off the gate.

FIG. 7 shows a cross-section of the exemplary TFT of FIG. 5 along the long axis of gate 20, orthogonal to the cross-section shown in FIG. 5. The structures in FIG. 7 are essentially the some as in FIGS. 5 and 6, but certain areas or portions 18a-b adjacent to electrically active thin film layer 16 may be present, and gate semiconductor layer 36 is shown (although it may not be present in many embodiments). In the exemplary TFT of FIG. 7, inactive portion 18b may insulate active area 12 from gate conductor 46, as well as provide mechanical support for gate metal 20 (which might otherwise have a step in it, which could lead to a relatively thin and/or high-stress region in gate metal 20). Inactive semiconductor thin film portions 18a and 18b are covered by gate metal layer 20 and are therefore not exposed or removed substantially by the selective etch step described above.

Figure 8:
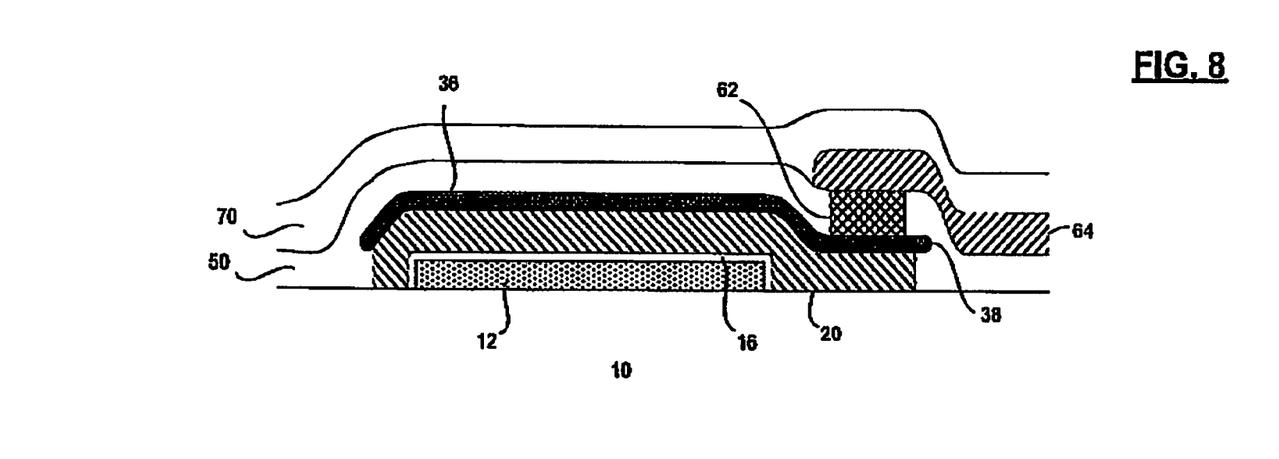
FIG. 8 shows a cross-sectional view of an alternative MOS TFT device to that of FIG. 7, along the long axis of the gate.

Alternatively, and as shown more clearly in FIG. 8, the conductor in electrical communication with gate 36/20 may comprise a contact 62 and an interconnect metal 64. Methods for forming such structures (and materials suitable for such structures) are known in the art. Contact 62 and interconnect metal 64 may be a unitary structure (i.e., they are formed as a result of the same processing steps), or they may be discrete structures (i.e., formed in different, and generally successive, processing steps). Contact 62 may be formed as a discrete structure by first forming a contact hole in dielectric layer 50 (e.g., by depositing and patterning a resist material over dielectric layer 50, then etching the exposed surface of dielectric layer 50), depositing a metal or conductor therein, and removing the metal or conductor from regions outside the contact hole. Contact 62 and interconnect metal 64 may be formed as a unitary structure by (i) conventional blanket deposition of a metal or conductor onto dielectric layer 50 having contact holes therein, then conventional photolithography and etching, (ii) printing a metal precursor ink onto dielectric layer 50 having contact holes therein; or (iii) a "dual damascene" approach (not shown in FIG. 8), in which a trench is etched part of the way through dielectric layer 50 (which preferably has contact holes already formed therein) in a pattern corresponding to interconnect metal 64, then a metal or conductor is blanket deposited (or printed) onto dielectric layer 50, and the metal or conductor in regions outside the contact hole and trench is removed.

Referring back to FIG. 5, after forming conductors 42 and 44, the present method may further comprise the step of passivating the device containing the TFT (e.g., forming a passivation or dielectric layer 50 over the conductive structures 42 and 44, gate metal/semiconductor layers 20/36, and, to the extent they are exposed, portions of source and drain terminals 32 and 34, semiconductor layer 12 and substrate 10). Passivation layer 50 generally inhibits or prevents the ingress or water, oxygen, and/or other species that could cause the degradation or failure of the device, and may add some mechanical support to the device, particularly during further processing. The passivation layer 50 may be formed by conventionally coating the upper surface of the device with one or more inorganic barrier layers such as a polysiloxane; a nitride oxide and/or oxynitride of silicon and/or aluminum; and/or one or more organic barrier layers such as parylene, a fluorinated organic polymer, or other barrier material.

As shown in FIG. 8, when the device contains two layer, of metal, a second dielectric or passivation layer 70 is formed over the device. In this case, the first dielectric layer 50 may be considered an "interlayer dielectric," and the second dielectric layer 70 may be the passivation layer. In this embodiment the first dielectric layer 50 may comprise a material having lower stress than passivation layer 70. For example, first dielectric layer 50 may comprise an oxide, such as $SiO_2$ (e.g., CVD TEOS), USG, FSG, BPSG, etc., and passivation layer 70 may comprise silicon nitride or a silicon oxynitride. Also, passivation layer 70 may have a thickness slightly greater than that of first dielectric layer 50.

Exemplary MOS Transistors

One aspect of the invention relates to an electronic device, comprising (a) an electrically functional substrate (e.g., containing an inorganic semiconductor); (b) a dielectric film on at least portions of the electrically functional substrate; (c) a laser patterned metal gate on the dielectric film; and (d) source and drain terminals comprising a doped inorganic semiconductor layer on the substrate adjacent (or substantially adjacent) to the gate. In one embodiment, each of the source and drain terminals has a border closest to the metal gate that is substantially aligned with a border of the metal gate. Generally, the electronic device further comprises (i) one or more first conductors electrically connected to each of the source and drain terminals and (ii) a second conductor electrically connected to the gate metal layer.

In certain embodiments (e.g., a thin film transistor [TFT], such as a MOS TFT), the electrically functional substrate comprises an electrically inert substrate and an electrically active layer (e.g., a lightly doped semiconductor, or transistor channel layer) thereon. In such an embodiment, the doped semiconductor layer comprises an electrically active, polycrystalline semiconductor layer that generally functions as a transistor channel. Typically, the device comprises a MOS TFT, although the technology is applicable to other types of transistors having regions or terminals at different horizontal levels, or made from different materials or fabricated on a different substrate (e.g., an EAS or RFID tag, fabricated on a metal foil or sheet) that may benefit from laser-patterned metal gates. Also, as explained below, the present MOS TFT can be configured to form other ends of electronic devices.

Generally, the semiconductor material of the source and drain terminals comprises (i) a Group IVA element, a III-V compound semiconductor such as GaAs, or a II-VI (or chalcogenide compound) semiconductor such as ZnO or ZnS, and (ii) a dopant element. Preferably, the semiconductor comprises Si and/or Ge and a dopant selected from the group consisting of B, P, As and Sb. Where the source and drain terminals are formed from a doped silane ink, the dopant has a concentration profile (e.g., dopant concentration as a function of semiconductor layer thickness) that is substantially uniform throughout substantially the entire thickness of the semiconductor layer. Such semiconductor thin films and methods for making the same are disclosed in copending U.S.

patent application Ser. No. 10/949,013, filed on Sep. 24, 2004, the relevant portions of which are incorporated herein by reference. In various embodiments, the source and drain terminals consist essentially of heavily doped polysilicon, and/or the dopant in the material forming the source and drain terminals 32 and 34 is substantially uniformly distributed throughout substantially the entire thickness of the source and drain terminal films 32 and 34 (see, e.g., FIG. 4).

In another embodiment, the interface between source/drain terminals 32 and 34 and lightly doped semiconductor layer 12 is substantially coplanar with the interface between gate dielectric layer 16 and semiconductor layer 12. Consequently, the present MOS TFT may have a raised or elevated source/drain configuration. Alternatively, a thin upper portion of semiconductor layer 12 on which the source/drain terminals 32 and 34 are formed may be etched to form recessed source/drain terminals.

FIG. 5 shows a cross-section of a first exemplary electronic device according to the present invention, a TFT made by an exemplary embodiment of the present method. As explained above with respect to the preset method, the exemplary electronic device of FIG. 5 comprises electrically inactive substrate 10, semiconductor layer 12 (which may be lightly doped and which may function in part as the TFT channel) thereon, a dielectric layer 16 on semiconductor 12, a gate comprising gate metal layer 20 on gate dielectric layer 16 and gate semiconductor layer 36 on gate metal layer 20, source and drain terminals 32 and 34 on semiconductor layer 12, conductors 42 and 44 on source and drain terminals 32 and 34, and passivation layer 50 over the entire device. As mentioned above, the borders of source and drain terminals 32 and 34 closest to the gate are self-aligned with the outermost border of gate semiconductor layer 36 along the length of gate semiconductor layer 36 (i.e., normal to the plane of the page on which FIG. 5 is shown). In those cases where gate semiconductor layer 36 is removed or consumed, the borders of source/drain terminal films 32 and 34 closest to gate metal layer 20 are still aligned with the closest border of gate metal layer 20, but with a small offset (as explained herein).

In the embodiment of FIG. 5, the gate semiconductor layer 36 has a width greater than the width of the gate metal layer 20 (to the extent gate semiconductor layer 36 is present in the device), and the gate metal layer 20 has a width greater than the width of the gate dielectric layer 16. The width of gate semiconductor layer 36 (or of a metal silicide corresponding to such a layer) is greater than the width of the gate metal layer 20 generally by about two times the thickness of gate semiconductor layer 36. In various embodiments, gate metal 20 has a width of at least 0.1 microns, 0.5 microns, 1 micron, or 2 microns. In one implementation, the minimum gate width is about 5 microns. Gate metal 20 may have a length of from about 1 μm to about 1000 μm or any range of values therein (e.g., from about 2 ∞m to about 200 μm or from about 5 μm to about 100 μm, etc.), and a thickness of from about 50 nm to about 10,000 nm or any range of values therein (e.g., from about 100 to about 5000 nm or from about 200 to about 2000 nm, etc.). The source and drain terminal 32 and 34 (and, to the extent it may be present, the gate semiconductor layer 36) may have a thickness of from 10 to 1000 nm or any range of values therein (e.g., from 100, 200, or 250 Å to 10,000, 1000, or 500 Å). The source and drain terminals 32 and 34 may comprise one or more layers of heavily doped semiconducting material, formed as described above, in which the layers may have the same or different dopants and doping levels.

The present electronic device may further comprise (i) one or more first conductors (e.g., 42 and 44 in FIG. 5) electrically connected to each of the source and drain terminals, and/or (ii) a second conductor (e.g., 46 in FIGS. 6-7 or conductor 64 and via/contact 62 in FIG. 8) electrically connected to the gate. In one typical embodiment, each of the source and drain terminals 32 and 34 and the gate have a unique conductor in electrical contact therewith. The conductors may comprise or consist essentially of one or more layers of the conductive and/or barrier materials described above with regard to the present method. Also, as shown in FIGS. 6 and 8, the conductor 46 in electrical contact with the gate may be in physical contact with a "landing pad" region 38 or the gate. Landing pad 38 generally has a width of at least about 1.25, 1.33 or 1.5 times the width of metal 20, up to about 2, 3 or 4 times the width of gate metal 20. Landing pad 38 also may be located some finite and/or predetermined distance away from source and drain terminals 32 and 34.

Alternatively, one or more of the conductors 42, 44 and 46 (and in one implementation, the conductor in electrical communication with the gate) may be in electrical communication with a transistor terminal (e.g., gate metal layer 20 and/or gate semiconductor layer 36) through a conductive contact. FIG. 8 shows a cross-section of an exemplary embodiment of this alternative structure, along the length of the gate. A contact 62 may be formed in dielectric layer 50 by first etching a hole therein at a location over gate landing pad 38, then depositing a conductive material (selected from among those described herein) in the hole. Excess conductive material may then be removed from as outside the hole by conventional techniques to form contact 62. Conductor 64 is then formed in electrical contact with contact 62 by any of the techniques described herein for forming conductors, and a passivation layer 70 is formed thereover.

Conductors in communication with one of the source/drain terminals or the gate terminal may also be coupled to or continuous with another one of the conductors. For example, in a diode-configured transistor, a conductor may be in electrical communication with one source/drain terminal and the gate. In a capacitor-configured transistor, a conductor may be in electrical communication with both source/drain terminals. Alternatively, a thin dielectric layer may be formed over a source/drain terminal, and a conductor capacitively coupled to the underlying source/drain terminal may be formed thereover.

As shown in FIGS. 5, 7 and 8, the present electronic device may further comprise a dielectric and/or passivation layer over the conductor(s) and the gate. FIGS. 5 and 7 show a single passivation layer 50 over the transistor device. FIG. 8 shows a first, underlying dielectric layer 50 (an "interlayer dielectric") and a second, overlying dielectric passivation layer 70. Each of the two dielectric layers may be deposited over a pattern of conductors configured to interconnect (directly or indirectly) various terminals of electronic devices on a single substrate to one another. As explained above, contacts (e.g., contact 62 in FIG. 8) may electrically couple a lower metal layer (e.g., containing conductors 42 and 44 in FIG. 5) to an upper metal layer (e.g., one containing conductor 64 in FIG. 8).

The gate dielectric film 16 in the present electronic device may comprise any of the materials for the wire dielectric film 16 described above with regard to the present method. The gate dielectric film 16 may have a width and length slightly less than the corresponding dimensions of the gate metal layer 20 when it is wet etched, but the two layers 16 and 20 will have substantially the same width and length when gate dielectric film 16 is dry etched. Gate dielectric film 16 may have a thickness of from 20 Å to 400 Å or any range of values therein (e.g., from 30 to 300 Å, or from 50 to 200 Å, etc.). Alternatively, a thicker gate dielectric layer (e.g., in the range of from 500 to 2000 Å, and in one implementation, on the order of about 1500 Å) could be used, along with higher dielectric constant materials than silicon dioxide or aluminum oxide. In one embodiment, the gate dielectric film 16 has a thickness greater than the thickness of the heavily doped source and drain terminals 32 and 34, largely to minimize the possibility that source and drain terminals 32 and 34 may form an electrical connection to gate metal layer 20. However, for high speed transistors, generally a thin gate dielectric film 16 is preferred.

The electrically functional substrate in the present electronic device may comprise a mechanical support structure, such as a single crystal silicon wafer or metal foil having an insulator layer thereon or an electrically inert or inactive substrate such as a plastic sheet or glass plate, with an electrically active layer thereon. As described above, in one embodiment, the electrically active layer comprises a semiconductor (transistor channel) layer 12, which may be lightly doped (e.g., having a dopant concentration of from about $10^{16}$ to about $5 \times 10^{18}$ atoms/cm$^3$). Similar to the heavily doped semiconductor of the source/drain terminals 32 and 34 and the gate semiconductor layer 36, lightly doped semiconductor layer 12 may have a concentration profile (e.g., dopant concentration as a function of semiconductor layer thickness) that is substantially uniform throughout substantially the entire thickness of the semiconductor layer.

Typical semiconductor layer 12 thicknesses may be from about 30, 75 or 100 nm to about 200, 500 or 1000 nm. The film thickness may be chosen to optimize the electrical properties of the transistor. In preferred embodiments, semiconductor layer 12 comprises or consists essentially of a lightly doped inorganic semiconductor material, such as one or more Group IVA elements (e.g., silicon and/or germanium), a so-called "III-V" material (e.g., GaAs), a II-VI (or chalcogenide) conductor, etc., further containing a dopant (such as B, P, As or Sb) in a concentration of from ~$10^{16}$ to ~$5 \times 10^{18}$ atoms/cm$^3$. Exemplary lightly doped semiconductor films are disclosed in copending U.S. application Ser. No. 10/949,013, filed Sep. 24, 2004, the relevant portions of which are incorporated herein by reference.

Suitable electrically inert or inactive substrates may comprise a plate, disc, and/or sheet of a glass, ceramic, dielectric and/or plastic. Alternatively, suitable electrically conductive substrates may comprise a wafer, disc, sheet and/or foil of a semiconductor (e.g. silicon) and/or a metal. In the case where the substrate comprises a metal sheet and/or foil, the device may further comprise an inductor and/or capacitor, and the method may further comprise forming an inductor and/or capacitor from the metal substrate. However, any such electrically conductive substrate should have an insulator layer between it and any electrically active layer or structure thereover (e.g., semiconductor layer 12) except where electrical contact is to be made from the devices on the insulator to a structure formed in the metal substrate (e.g., one or more metal pads of an interposer, inductor and/or capacitor for an EAS or RFID tag; see, e.g., U.S. application Ser. No. 10/885,283 and/or U.S. Provisional Application Nos. 60/592,596 and 60/617,617, respectively filed on Jul. 6, 2004, Jul. 31, 2004, and Oct. 8, 2004). Preferably, the substrate comprises a member selected from the group consisting of a silicon wafer, a glass plate, a ceramic plate or disc, a plastic sheet or disc, metal foil, a metal sheet or disc, and laminated or layered combinations thereof (such as electrically inactive substrate 10 having lightly doped semiconductor layer 12 thereon), the electrically conductive members of which generally have an insulator layer (e.g., a layer of the corresponding oxide) thereon.

CONCLUSION/SUMMARY

Thus, the present invention provides an electronic device (such as a MOS transistor) having a laser-patterned metal gate, and a method for its manufacture. The method generally comprises (1) forming a layer of metal-containing material on a dielectric film, wherein the dielectric film is on an electrically functional substrate comprising an inorganic semiconductor, (2) laser patterning a metal gate from the metal-containing material layer; and (3) forming source and drain terminals in the inorganic semiconductor in locations substantially adjacent to the metal gate. The device generally comprises (a) a conductor (e.g., thin film) substrate; b) a dielectric film on portions of the electrically functional substrate, (c) a laser patterned gate metal layer on the dielectric film; and (d) source and drain terminals comprising a doped layer on or in the electrically functional substrate, substantially adjacent to the metal gate.

The present invention advantageously provides a low cost method for making MOS TFTs having reliable, commercially acceptable electrical characteristics (e.g., on/off speeds and ratios, carrier mobilities, $V_t$'s, etc.). Printed and/or radiation-defined semiconductor structures (and, optionally, printed and/or radiation-defined conductor structures) may provide (1) results similar to structures formed by more conventional approaches, but at a much lower cost and at a much higher throughput (on the order of hours to days, as opposed to weeks to months) than conventional MOS semiconductor process technology, and (2) higher resolution patterning capability and similar or higher throughput as compared to conventional graphic arts printing technology (e.g., inkjetting) Relative to dry etching, one or more optional wet etches of the laser-patterned metal gate layer may provide narrower gate and/or transistor channel widths, and of dielectric materials may provide increased throughput and/or improved etch selectivity.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain The principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An electronic device, comprising:
   a) a substrate;
   b) a semiconductor layer on the substrate;
   c) a dielectric film on at least portions of said substrate and/or said semiconductor layer;
   d) a laser written metal gate on the dielectric film; and
   e) source and drain terminals comprising a doped layer on or in said semiconductor layer, substantially adjacent to said laser written metal gate, wherein each of said source and drain terminals has a border closest to said laser written metal gate that is substantially aligned with a border of said laser written metal gate.

2. The electronic device of claim 1, further comprising (i) one or more first conductors electrically connected to each of said source and drain terminals and (ii) a second conductor electrically connected to said laser written metal gate.

3. The electronic device of claim 2, wherein said second conductor comprises at least one conductive and/or barrier layer, and said second conductor contacts a landing pad region of the laser written metal gate.

4. The electronic device of claim 3, wherein said landing pad region has a width of from 1.25 to 4 times a width of said laser written metal gate.

5. The electronic device of claim 2, further comprising a second dielectric and/or a passivation layer over said first and second conductors and said laser written metal gate.

6. The electronic device of claim 1, wherein said substrate and said semiconductor layer comprise an electrically inert substrate and a transistor channel layer thereon.

7. The electronic device of claim 6, wherein said transistor channel layer comprises a lightly doped semiconductor.

8. The electronic device of claim 1, wherein said doped layer comprises an electrically active, polycrystalline Group IVA semiconductor layer.

9. The electronic device of claim 1, wherein said dielectric film has a thickness of from 20 Å to 400 Å.

10. The electronic device of claim 1, wherein said laser written metal gate has a width greater than a width of said dielectric film.

11. The electronic device of claim 1, wherein said laser written metal gate has a width of at least 2 microns.

12. The electronic device of claim 1, wherein said laser written metal gate has a width of at least 5 microns.

13. The electronic device of claim 1, wherein said laser written metal gate consists essentially of a metal or a metal alloy.

14. The electronic device of claim 13, wherein said laser written metal gate consists essentially of cured and/or annealed metal nanoparticles.

15. The electronic device of claim 1, wherein said laser written metal gate has a thickness of from 50 nm to 5000 nm.

16. The electronic device of claim 1, wherein said source and drain terminals comprise a heavily doped semiconductor layer.

17. The electronic device of claim 1, wherein said dielectric film has a thickness greater than a thickness of said source and drain terminals.

18. The electronic device of claim 1, wherein said substrate comprises a glass plate, a ceramic plate or disc, a plastic sheet or disc, metal foil, a metal sheet or disc, or a laminated or layered combination thereof.

19. The electronic device of claim 18, wherein said substrate comprises said metal foil and a barrier layer directly thereon.

20. The electronic device of claim 18, wherein said substrate comprises said metal foil and said dielectric layer directly thereon.

21. The electronic device of claim 1, wherein said laser written metal gate comprises a cured and/or annealed metal precursor, said metal precursor comprising at least one photodefinable metal-containing species.

22. The electronic device of claim 1, wherein said laser written metal gate comprises a directly irradiated metal precursor.

23. The electronic device of claim 1, wherein said laser written metal gate is formed by a process comprising directly irradiating a portion of a metal precursor and removing non-irradiated portions of said metal precursor with a developer.

24. An electronic device, comprising:
a) a substrate;
b) a semiconductor layer on the substrate;
c) a dielectric film on at least portions of said substrate and/or said semiconductor layer;
d) a laser written metal gate on the dielectric film, said metal gate having a width of at least 2 microns; and
e) source and drain terminals comprising a doped layer on or in said semiconductor layer, substantially adjacent to said laser written metal gate.

25. The electronic device of claim 24, wherein each of said source and drain terminals has a border closest to said laser written metal gate that is substantially aligned with a border of said laser written metal gate.

26. The electronic device of claim 24, further comprising (i) one or more first conductors electrically connected to each of said source and drain terminals and (ii) a second conductor electrically connected to said laser written gate.

27. The electronic device of claim 26, wherein said second conductor comprises at least one conductive and/or barrier layer, and said second conductor contacts a landing pad region of the laser written metal gate.

28. The electronic device of claim 27, wherein said landing pad region has a width of from 1.25 to 4 times a width of said laser written metal gate.

29. The electronic device of claim 26, further comprising a second dielectric and/or a passivation layer over said first and second conductors and said laser written metal gate.

30. The electronic device of claim 24, wherein said substrate and said semiconductor layer comprise an electrically inert substrate and a transistor channel layer thereon.

31. The electronic device of claim 30, wherein said transistor channel layer comprises a lightly doped semiconductor.

32. The electronic device of claim 24, wherein said doped layer comprises an electrically active, polycrystalline Group IVA semiconductor layer.

33. The electronic device of claim 24, wherein said dielectric film has a thickness of from 20 Å to 400 Å.

34. The electronic device of claim 24, wherein said laser written metal gate has a width greater than a width of said dielectric film.

35. The electronic device of claim 24, wherein said laser written metal gate has a width of at least 5 microns.

36. The electronic device of claim 24, wherein said laser written metal gate consists essentially of a metal or a metal alloy.

37. The electronic device of claim 36, wherein said laser written metal gate consists essentially of cured and/or annealed metal nanoparticles.

38. The electronic device of claim 24, wherein said laser written metal gate has a thickness of from 50 nm to 5000 nm.

39. The electronic device of claim 24, wherein said source and drain terminals comprise a heavily doped semiconductor layer.

40. The electronic device of claim 24, wherein said dielectric film has a thickness greater than a thickness of said source and drain terminals.

41. The electronic device of claim 24, wherein said substrate comprises a glass plate, a ceramic plate or disc, a plastic sheet or disc, metal foil, a metal sheet or disc, or a laminated or layered combination thereof 42. The electronic device of claim 41, wherein said substrate comprises said metal foil and a barrier layer thereon.

43. The electronic device of claim 41, wherein said substrate comprises said metal foil and said dielectric layer thereon.

44. The electronic device of claim 24, wherein said laser written metal gate comprises a cured and/or annealed metal precursor, said metal precursor comprising at least one photodefinable metal-containing species.

45. The electronic device of claim 24, wherein said laser written metal gate comprises a directly irradiated metal precursor.

46. The electronic device of claim 24, wherein said laser written metal gate is formed by a process comprising directly irradiating a portion of a metal precursor and removing non-irradiated portions of said metal precursor with a developer.

* * * * *